(12) United States Patent
Kim et al.

(10) Patent No.: US 9,039,478 B2
(45) Date of Patent: May 26, 2015

(54) APPARATUS FOR MANUFACTURING DEPOSITION MASK ASSEMBLY FOR FLAT PANEL DISPLAY

(71) Applicant: Samsung Display Co., Ltd., Yongin, Gyeonggi-Do (KR)

(72) Inventors: Eui-Gyu Kim, Yongin (KR); Suk-Ho Kang, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 29 days.

(21) Appl. No.: 14/062,358

(22) Filed: Oct. 24, 2013

(65) Prior Publication Data

US 2014/0120796 A1 May 1, 2014

(30) Foreign Application Priority Data

Oct. 25, 2012 (KR) .......................... 10-2012-0119148

(51) Int. Cl.
G02F 1/13 (2006.01)
G03F 1/22 (2012.01)

(52) U.S. Cl.
CPC ........................................ *G03F 1/22* (2013.01)

(58) Field of Classification Search
None
See application file for complete search history.

(56) References Cited

U.S. PATENT DOCUMENTS

| 4,547,696 | A | * | 10/1985 | Strauss | 313/407 |
| 4,591,344 | A | * | 5/1986 | Palac | 445/30 |
| 4,730,143 | A | * | 3/1988 | Fendley | 313/407 |
| 4,778,427 | A | | 10/1988 | Strauss | |
| 4,828,523 | A | * | 5/1989 | Fendley et al. | 445/30 |
| 4,834,686 | A | * | 5/1989 | Kautz et al. | 445/30 |

FOREIGN PATENT DOCUMENTS

| JP | 2010-050169 | 3/2010 |
| KR | 1020090059225 A | 6/2009 |
| KR | 100941007 B1 | 2/2010 |
| KR | 1020100090070 A | 8/2010 |

* cited by examiner

*Primary Examiner* — Ashok Patel
(74) *Attorney, Agent, or Firm* — Robert E. Bushnell, Esq.

(57) ABSTRACT

Provided is an apparatus for manufacturing a deposition mask assembly for a flat panel display, which prevents a pattern from being distorted in a pattern mask when divided pattern masks are welded to a support fixture. An apparatus for manufacturing a deposition mask assembly for a flat panel display of the present description, which includes a frame mask forming an opening, a support fixture installed in the frame mask, and a pattern mask welded to the support fixture to have a pattern allowing a deposition material to be transmitted therethrough, includes: a welding head disposed in a side of the pattern mask; and a support member supporting the support fixture in an opposite side of the welding head with the pattern mask interposed therebetween.

5 Claims, 7 Drawing Sheets

APPARATUS FOR MANUFACTURING DEPOSITION MASK ASSEMBLY FOR FLAT PANEL DISPLAY

CLAIM OF PRIORITY

This application makes reference to, incorporates the same herein, and claims all benefits accruing under 35 U.S.C. §119 from an application for APPARATUS FOR MANUFACTURING A DEPOSITION MASK ASSEMBLY FOR A FLAT PANEL DISPLAY earlier filed in the Korean Intellectual Property Office on Oct. 25, 2012 and there duly assigned Serial No. 10-2012-0119148.

BACKGROUND OF THE INVENTION

1. Field of the Invention

The present description relates to an apparatus for manufacturing a deposition mask assembly for a flat panel display.

2. Description of the Related Art

A flat panel display has characteristics such as light weight and slimness, and examples thereof include a liquid crystal display (LCD) and an organic light emitting diode (OLED) display. The OLED display has excellent luminescence and viewing angle characteristics as compared to the LCD and does not require a backlight, thus being implemented in an ultra-thin type.

The OLED display is a display device using a phenomenon that electrons injected from a cathode and holes injected from an anode are recombined in an organic thin film to form an exciton and light having a predetermined wavelength is generated by energy from the formed exciton.

The OLED display adopts a photolithography method or a deposition method using a deposition mask assembly in which a pattern including a plurality of slits is formed in order to selectively form the cathode, the anode, the organic thin film, and the like on a substrate formed of glass, stainless steel, or synthetic resin.

In the photolithography method, after a photoresist is applied on some regions, moisture may inflow in the course of stripping and etching the photoresist by a wet etching or dry etching method. On the other hand, the deposition method using the deposition mask assembly is used to a material that may deteriorate by moisture like the organic thin film.

Some organic light emitting diode (OLED) displays including R (red), G (green), and B (blue) organic emission layers are formed in order to display full-colors. Patterns of the R, G, and B organic emission layers are formed on a substrate by aligning a mask pattern on which a plurality of openings is formed on the substrate and providing a deposition material through an opening of the mask pattern.

For the deposition method, in a deposition mask assembly, a support fixture is installed to cross an opening of a frame mask, and the divided pattern masks are welded to the support fixture in order to prevent movement of the divided pattern masks on the support fixture.

The support fixture is fixed to both ends of the opening of the frame mask. Therefore, distortion of the pattern which may occur in the pattern mask while welding is performed. That is, a welding quality of the pattern mask may deteriorate.

The above information disclosed herein is only for enhancement of understanding of the background of the described technology and therefore it may contain information that does not form the prior art that is already known in the field to a person having ordinary skill in the art.

SUMMARY OF THE INVENTION

The present description has been made in an effort to provide an apparatus for manufacturing a deposition mask assembly for a flat panel display, which prevents a pattern from being distorted in a pattern mask when divided pattern masks are welded to a support fixture.

The present invention provides an apparatus for manufacturing a deposition mask assembly for a flat panel display, the deposition mask assembly including a frame mask forming an opening, a support fixture installed in the frame mask, and a pattern mask welded to the support fixture to have a pattern allowing a deposition material to be transmitted therethrough. The apparatus for manufacturing a deposition mask assembly includes a welding head disposed in a side of the pattern mask; and a support member supporting the support fixture in an opposite side of the welding head with the pattern mask interposed therebetween.

The support fixture may be disposed in parallel in the plural to cross the opening and be fixed to the frame mask, and the support member may be installed to correspond to each of a plurality of support fixtures.

The support member may include a rod ascending and descending toward the support fixture, and any one of a cylinder and a motor operating the rod.

The rod may have a support pin having a convex curved surface at an upper end that is in contact with the support fixture.

The apparatus for manufacturing a deposition mask assembly for a flat panel display may further include: a vision unit installed in an opposite side of the support member to sense supporting of the support member by a laser auto-focus.

According to an exemplary embodiment, there is an effect of minimizing a gap between a pattern mask and a support fixture by supporting the support fixture by a support member when the pattern masks are welded to the support fixture by a welding head. Therefore, it is possible to prevent a pattern from being distorted in the pattern mask after the pattern mask and the support fixture are welded.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components wherein.

DETAILED DESCRIPTION OF THE INVENTION

Figure 1:
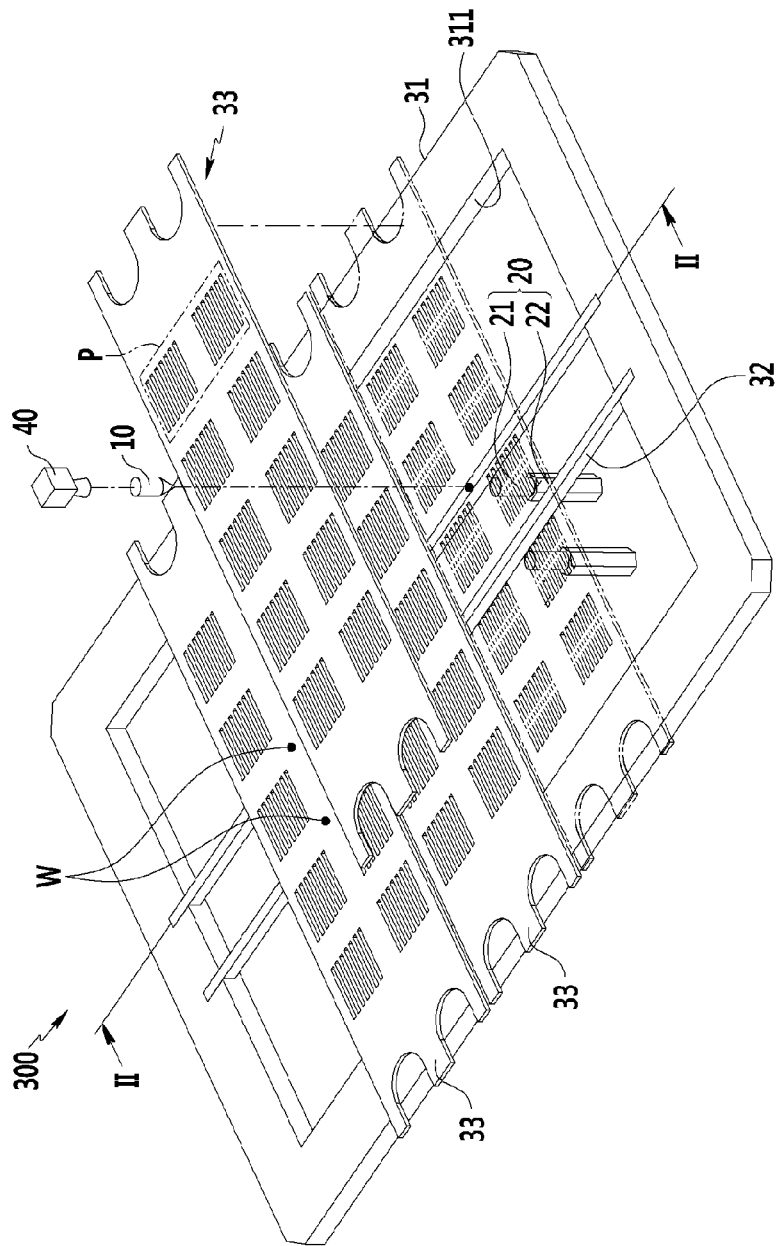
FIG. 1 is an exploded perspective view of an apparatus for manufacturing a deposition mask assembly for a flat panel display according to an embodiment of the present invention.

The present invention will be described more fully hereinafter with reference to the accompanying drawings, in which exemplary embodiments of the present invention are shown. The drawings and description are to be regarded as illustrative in nature and not restrictive. Like reference numerals designate like elements throughout the specification.

In addition, the size, forms, and thickness of each component shown in the drawings are arbitrarily shown for understanding and ease of description, but the present invention is not limited thereto. As those skilled in the art would realize, the described embodiments may be modified in various different ways, all without departing from the spirit or scope of the present invention. Accordingly, the embodiments are merely described below, by referring to the figures, to explain aspects of the present description.

Figure 2:
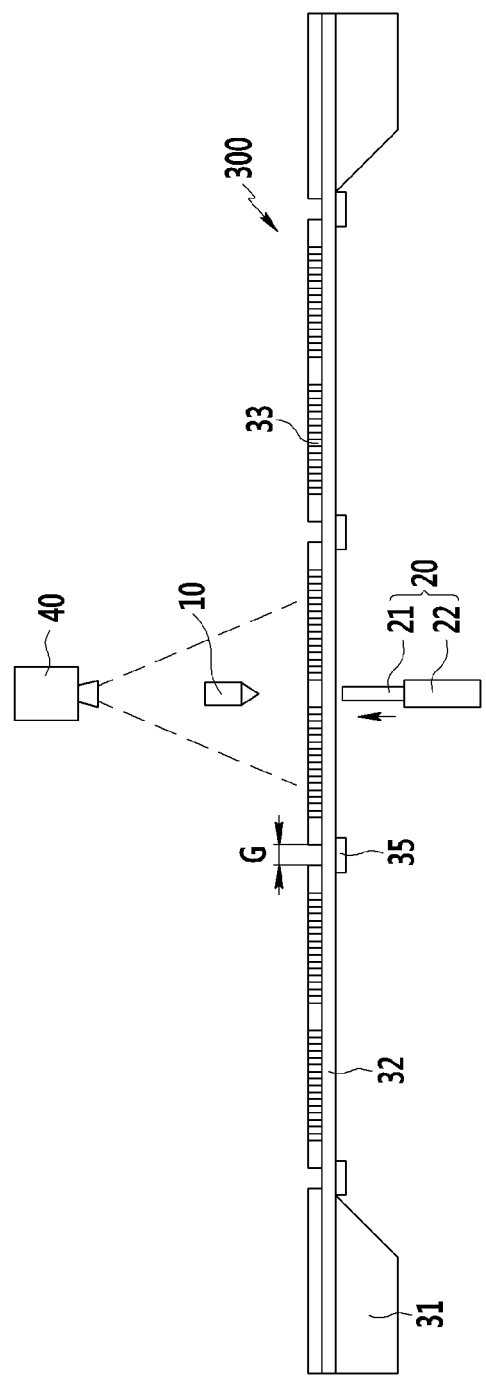
FIG. 2 is a cross-sectional view taken along the line II-II of FIG. 1.

FIG. 1 is an exploded perspective view of an apparatus for manufacturing a deposition mask assembly for a flat panel display according to an exemplary embodiment of the present invention, and FIG. 2 is a cross-sectional view taken along the line II-II of FIG. 1.

Referring to FIG. 1, the apparatus for manufacturing the deposition mask assembly of the embodiment includes a welding head 10 and a support member 20 for manufacturing a deposition mask assembly 300.

Figure 3:
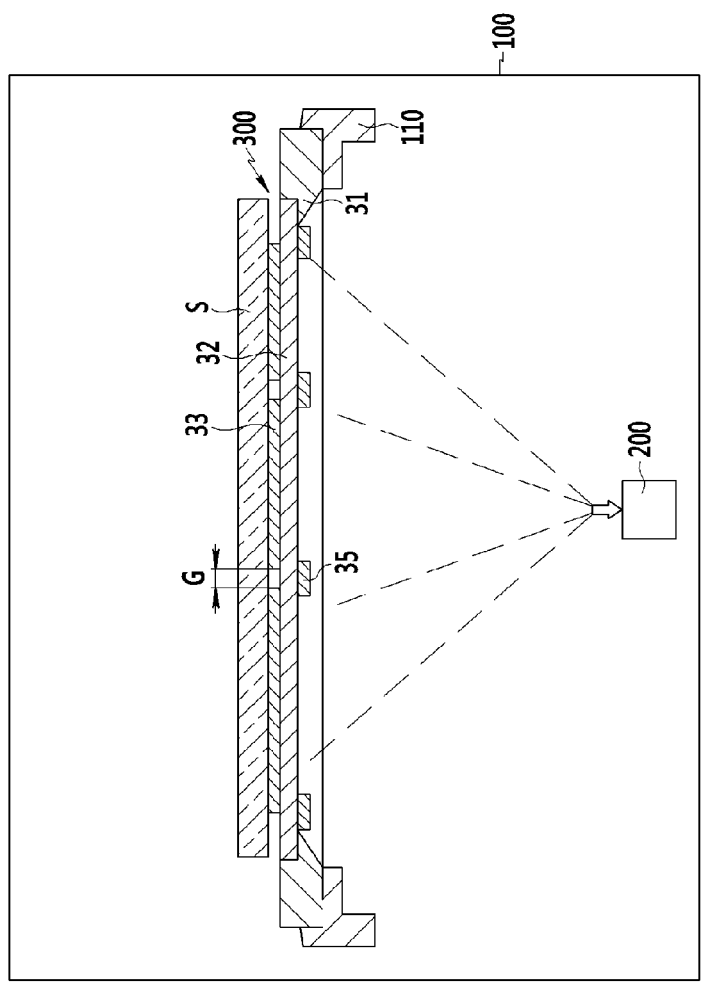
FIG. 3 is a cross-sectional view of an operation state where a deposition process is performed over a substrate by using the deposition mask assembly manufactured by the apparatus of FIG. 1.

FIG. 3 is a cross-sectional view of an operation state where a deposition process is performed over a substrate by using the deposition mask assembly manufactured by the apparatus of FIG. 1.

Referring to FIG. 3, a deposition apparatus for a flat panel display according to the exemplary embodiment of the present invention may include a chamber 100, a deposition source 200, and a deposition mask assembly 300 in order to deposit a deposition material on a substrate S.

The chamber 100 forms a space where a deposition process is performed over the substrate S. The deposition source 200 is installed in one side (for example, lower side) in the chamber 100 to vaporize the deposition material.

The deposition mask assembly 300 is disposed on one side (for example, upper side) of the deposition source 200. The deposition mask assembly 300 supports the substrate S at an upper surface, and allows the deposition material sprayed or vaporized from the deposition source 200 through a lower side to be transmitted therethrough, thus forming a pattern of the deposition material on the substrate S.

Further, the deposition apparatus for a flat panel display may further include a separate fixing member 110 for fixing the deposition mask assembly 300 in the chamber 100.

Referring to FIGS. 1 to 3 again, the deposition mask assembly 300 includes a frame mask 31, a support fixture 32, and a pattern mask 33. The frame mask 31 is fixed to the fixing member 110 to be disposed on the upper side of the deposition source 200 in the deposition apparatus, and an opening 311 is formed therein to transmit the vaporized deposition material therethrough. For example, the frame mask 31 may be formed to have a quadrangle frame structure having a long side and a short side around the opening 311.

The support fixture 32 crosses the opening 311 on the frame mask 31 to be fixed to the frame mask 31. The support fixture 32 may be welded to the frame mask 31. Further, more than one support fixture 32 may be provided to be disposed in parallel with the long side of the frame mask 31.

The upper surface of the support fixture 32 and the upper surface of the frame mask 31 have the same height to form a flat surface. Accordingly, the pattern mask 33 may be supported by the support fixture 32 on the opening 311, and may be supported by the frame mask 31 around the opening 311.

The pattern mask 33 is disposed on the upper surfaces of the support fixture 32 and the frame mask 31, and fixed to the support fixture 32 by welding (for example, cross welding).

In an apparatus for manufacturing the deposition mask assembly, the welding head 10 is disposed at an upper part of the pattern mask 33 to weld the pattern mask 33 to the support fixture 32.

The pattern mask 33 may have a pattern P to transmit the deposition material vaporized from the deposition source 200 of the deposition apparatus to a side of the substrate S.

The pattern mask 33 may be disposed on the upper surface of the frame mask 31 to be fixed to the upper surface of the support fixture 32 by welding, thus preventing the pattern P from being moved during the deposition process.

In FIG. 1, the pattern mask 33 is formed in the plural by division, and thus a plurality of the pattern masks 33 is disposed to correspond to one frame mask 31. Accordingly, a plurality of the pattern masks 33 is installed on the support fixture 32 to be spaced apart from each other at a space G. A plurality of the pattern masks 33 may be welded to the support fixture 32 to prevent movement between the pattern masks 33.

In the apparatus for manufacturing the deposition mask assembly, the support member 20 supports the support fixture 32 at an opposite side of the welding head 10 with the pattern mask 33 interposed therebetween. For example, when the pattern mask 33 is disposed on the upper surface of the support fixture 32, the support member 20 is disposed on the lower side of the support fixture 32.

That is, when the pattern mask 33 is welded to the support fixture 32 by the welding head 10, the support member 20 may support the support fixture 32 at the lower side of the support fixture 32 to minimize the gap between the support fixture 32 and the pattern mask 33.

Accordingly, in the case where the support fixtures 32 is provided in the plural, the support member 20 may be provided in the plural to be installed to correspond to each of a plurality of the support fixtures 32, thus reducing gaps between the support fixtures 32 and the pattern masks 33 corresponding to each other.

The support member 20 may be formed of a rod 21 ascending and descending toward the support fixture 32 and a cylinder 22 or a motor (not illustrated) operating the rod 21. For example, while welding is performed, the rod 21 ascends according to ascending of the cylinder 22 to upwardly push the support fixture 32 to the side of the pattern mask 33.

Accordingly, it is possible to minimize the gap between the pattern mask 33 receiving a load from welding head during the welding process and the support fixture 32 by ascending the rod 21. Further, it is possible to as it is maintain a state where the divided pattern masks 33 are disposed in parallel with each other.

A welding point W of the pattern mask 33 and the support fixture 32 is formed between a portion where the pattern P is not formed in the pattern mask 33, that is, a portion between the patterns P, and the support fixture 32 corresponding thereto. In addition, a supporting point of the support fixture 32 supported by the support member 20 may be formed to correspond to one welding point W of the welding points.

As described above, since the support fixture 32 is welded between the patterns P of the pattern mask 33, it is possible to prevent blocking of the pattern P of the pattern mask 33 by welding of the support fixture 32 and the pattern mask 33.

The deposition mask assembly 300 may further include a crack blind mask 35. The crack blind mask 35 is installed on the lower surface of the support fixture 32 to correspond to the spaces G of the pattern masks 33, which are spaced apart from each other, on the opposite side of the pattern mask 33.

Accordingly, the deposition material vaporized from the deposition source 200 is blocked by the crack blind mask 35 between the pattern masks 33 not to be unnecessarily deposited on the substrate S corresponding to the gap G.

Figure 4:
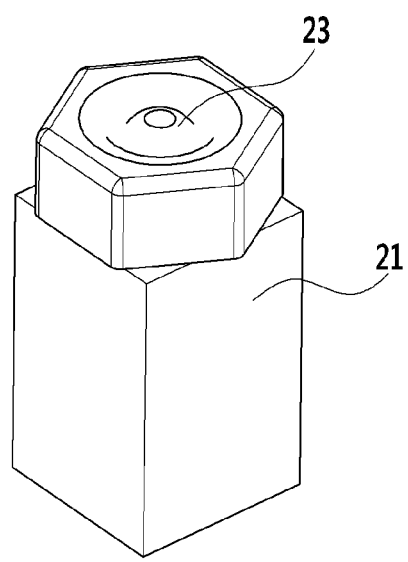
FIG. 4 is a perspective view of an upper end of a support member applied to FIG. 1.
Figure 5:
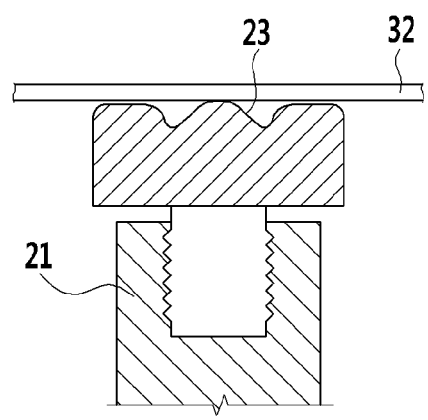
FIG. 5 is a cross-sectional view of a state where a support fixture is supported by the support member applied to FIG. 4.

FIG. 4 is a perspective view of an upper end of a support member 20 applied to FIG. 1, and FIG. 5 is a cross-sectional view of a state where a support fixture 32 is supported by the support member 20 applied to FIG. 4. Referring to FIGS. 4 and 5, the rod 21 of the support member 20 has a support pin 23 having the convex curved surface at the upper end that is in contact with the support fixture 32.

The support pin 23 may support the lower surface of the support fixture 32 by the convex curved surface to minimize friction between the upper end of the rod 21 and the support fixture 32 by a sliding action of the support pin 23 when the support member 20 and the pattern mask 33 are welded.

Accordingly, when the pattern mask 33 is welded to the support fixture 32 by using the welding head 10, the convex curved surface of the support pin 23 may prevent distortion of the pattern P of the pattern mask 33 welded to the support fixture 32 by friction with the support fixture 32.

Although not illustrated in the drawings, in the case where the support fixture 32 is supported by providing a ball to the upper end of the rod 21, it is possible to further reduce the friction formed between the upper end of the rod 21 and the support fixture 32 by a cloud action of the ball.

Referring to FIGS. 1 to 3 again, the apparatus for manufacturing the deposition mask assembly for the flat panel display according to an exemplary embodiment of the present invention may further include a vision unit 40 installed at an upper side of the welding head 10 opposite to the support member 20.

The vision unit 40 is disposed at the upper part of the pattern mask 33 to shoot an upper image of the pattern mask 33 welded to the support fixture 32, thus allowing the degree of supporting of the support fixture 32 by the support member 20 to be sensed by a laser auto-focus.

When the pattern mask 33 is welded to the support fixture 32, the vision unit 40 may allow an ultra-small condition (for example, 1 micrometer) in which distortion of the pattern P of the pattern mask 33 can be allowed to be ensured.

In an Experimental Example, the apparatus for manufacturing the deposition mask assembly for a flat panel display allows the support member 20 to ascend to bring the support member 20 into contact with the support fixture 32 and then perform further ascending by 160 micrometers, thus welding the pattern mask 33 to the support fixture 32.

In this case, the vision unit 40 shoots the image at the upper part of the supporting point of the support member 20 on the pattern mask 33. The size of the shot nugget image is 200 micrometers, and the maximum distortion of the pattern P in the pattern mask 33 is 1 micrometer.

In another Experimental Example, the apparatus for manufacturing the deposition mask assembly for a flat panel display allows the support member 20 to ascend to bring the support member 20 into contact with the support fixture 32 and then perform further ascending by 260 micrometers, thus welding the pattern mask 33 to the support fixture 32.

In this case, the vision unit 40 shoots the image at the upper part of the supporting point of the support member 20 on the pattern mask 33. The size of the shot nugget image is 200 micrometers, and the maximum distortion of the pattern P in the pattern mask 33 is 0.7 micrometers.

In yet another Experimental Example, the apparatus for manufacturing the deposition mask assembly for a flat panel display allows the support member 20 to ascend to bring the support member 20 into contact with the support fixture 32 and then perform further ascending by 500 micrometers, thus welding the pattern mask 33 to the support fixture 32.

In this case, the vision unit 40 shoots the image at the upper part of the supporting point of the support member 20 on the pattern mask 33. The size of the shot nugget image is 230 micrometers, and the maximum distortion of the pattern P in the pattern mask 33 is 0.7 micrometers.

As described above, it can be confirmed that the degree of distortion of the pattern P in the pattern mask 33 is within an allowable ultra-small condition (for example, 1 micrometer) by using the welding head 10, the support member 20, and the vision unit 40.

Further, it is possible to minimize distortion of the pattern P when the pattern mask 33 is welded to the support fixture 32 by the welding head 10 by sensing the degree of distortion of the pattern P in the pattern mask 33 shot by the vision unit 40 and controlling the degree of ascending of the support member 20 by a controller (not illustrated) based on the distortion data.

Figure 6:
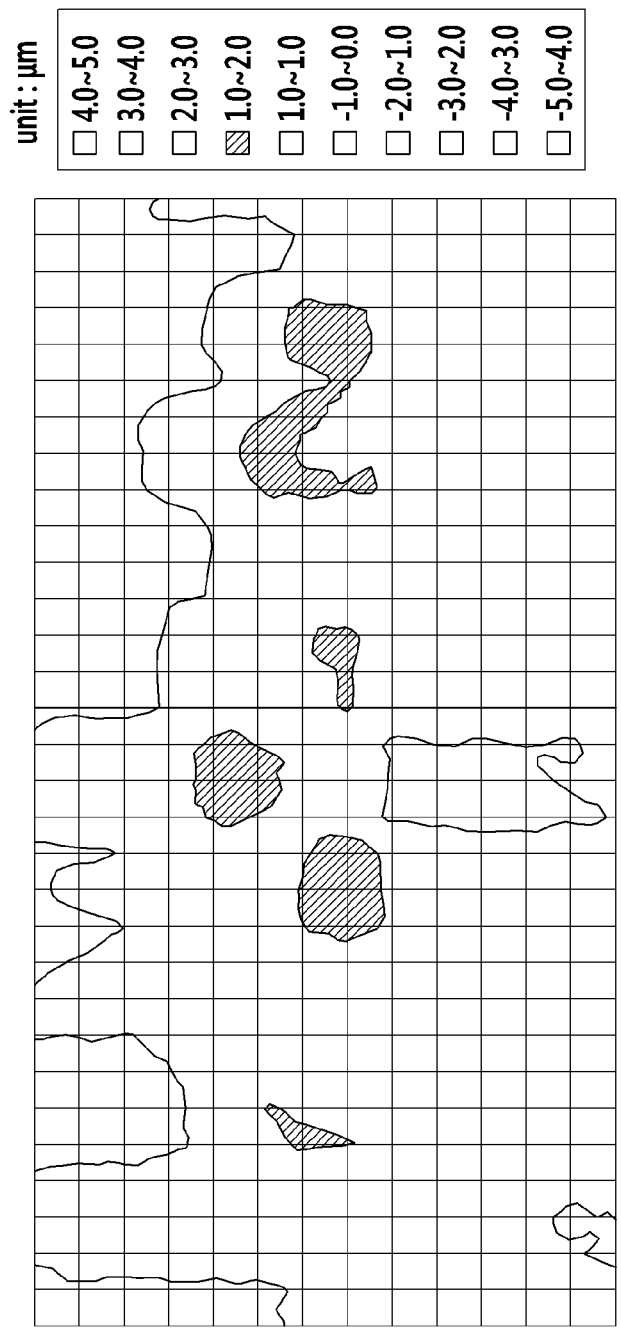
FIG. 6 is a graph illustrating a state where a position of a pattern mask is changed before and after welding is performed when the support member is applied.
Figure 7:
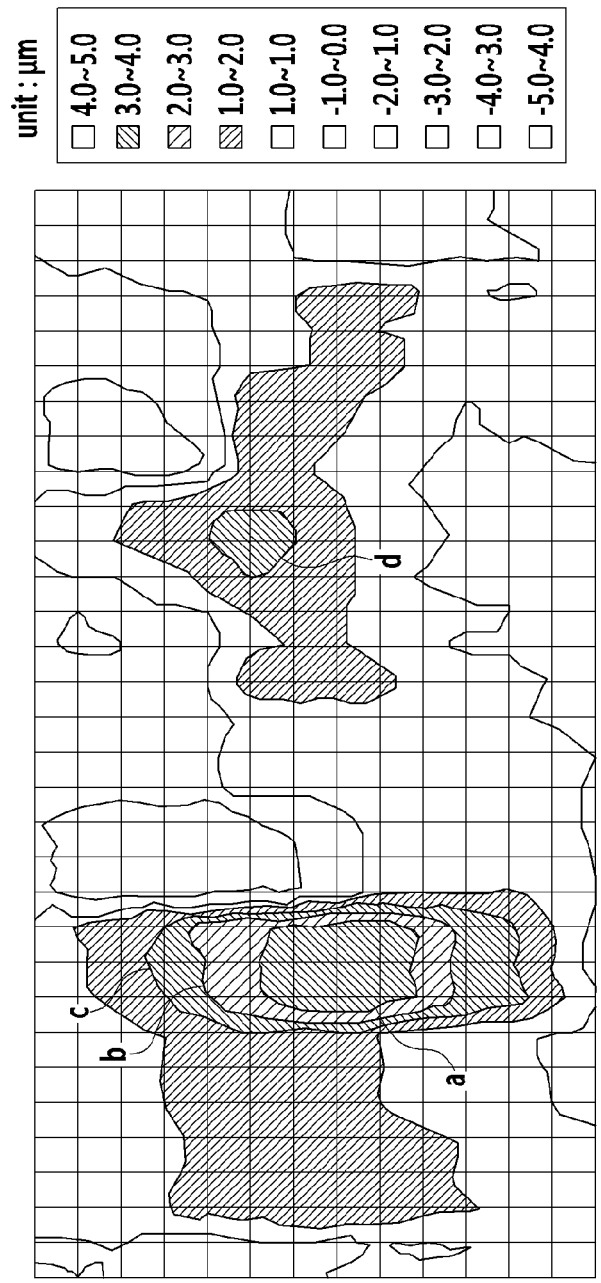
FIG. 7 is a graph illustrating a state where the position of the pattern mask is changed before and after welding is performed when the support member is not applied.

FIG. 6 is a graph illustrating a state where a position of a pattern mask is changed before and after welding is performed when the support member is applied, and FIG. 7 is a graph illustrating a state where the position of the pattern mask is changed before and after welding is performed when the support member is not applied.

Referring to FIG. 6, in review of the degree of distortion of the pattern P shot by the vision unit 40, in the case where the pattern masks 33 are welded by applying the support member 20, the distortion of the pattern P is within 1 micrometer (allowable ultra-small condition). That is, distortion defects of the pattern P of the pattern mask 33 are reduced.

Referring to FIG. 7, in review of the degree of distortion of the pattern P shot by the vision unit 40, in the case where the pattern masks 33 are welded by not applying the support member 20, the distortion of the pattern P is at the level of 3 to 6 micrometers (more than the allowable ultra-small condition). That is, many distortion defects a, b, c, and d of the pattern of the pattern mask occur.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An apparatus for manufacturing a deposition mask assembly for a flat panel display, the deposition mask assembly comprising a frame mask forming an opening, a support fixture installed in the frame mask, and a pattern mask welded to the support fixture to have a pattern allowing a deposition material to be transmitted therethrough, the apparatus comprising:
 a welding head disposed in a side of the pattern mask; and
 a support member supporting the support fixture in an opposite side of the welding head with the pattern mask interposed therebetween.

2. The apparatus of claim 1, wherein the support fixture is disposed in parallel in the plural to cross the opening and be fixed to the frame mask, and the support member is installed to correspond to each of a plurality of support fixtures.

3. The apparatus of claim 1, wherein the support member comprises a rod ascending and descending toward the support fixture, and any one of a cylinder and a motor operating the rod.

4. The apparatus of claim 3, wherein the rod has a support pin having a convex curved surface at an upper end that is in contact with the support fixture.

5. The apparatus of claim 3, further comprising a vision unit installed in an opposite side of the support member to sense supporting of the support member by a laser auto-focus.

* * * * *